(12) United States Patent
Büchner et al.

(10) Patent No.: US 12,001,000 B2
(45) Date of Patent: Jun. 4, 2024

(54) ILLUMINATION UNIT FOR MICROSCOPES

(71) Applicant: Carl Zeiss Microscopy GmbH, Jena (DE)

(72) Inventors: Anna Maria Büchner, Munich (DE); Nils Egewardt, Jena (DE); Nico Presser, Jena (DE); Peter Schacht, Erfurt (DE)

(73) Assignee: Carl Zeiss Microscopy GmbH, Jena (DE)

( * ) Notice: Subject to any disclaimer, the term of this patent is extended or adjusted under 35 U.S.C. 154(b) by 264 days.

(21) Appl. No.: 17/596,640

(22) PCT Filed: May 14, 2020

(86) PCT No.: PCT/EP2020/063461
§ 371 (c)(1),
(2) Date: Dec. 15, 2021

(87) PCT Pub. No.: WO2020/254042
PCT Pub. Date: Dec. 24, 2020

(65) Prior Publication Data
US 2022/0299745 A1 Sep. 22, 2022

(30) Foreign Application Priority Data

Jun. 18, 2019 (DE) .................... 10 2019 208 858.9

(51) Int. Cl.
*G02B 21/08* (2006.01)
*G02B 7/00* (2021.01)

(52) U.S. Cl.
CPC ........... *G02B 21/08* (2013.01); *G02B 21/084* (2013.01); *G02B 7/008* (2013.01)

(58) Field of Classification Search
None
See application file for complete search history.

(56) References Cited

U.S. PATENT DOCUMENTS 5,713,661 A * 2/1998 White ............... G01N 21/8806
362/17
5,969,854 A 10/1999 Stelzer et al.
(Continued)

FOREIGN PATENT DOCUMENTS

CN 1458543 11/2003
CN 106969308 7/2017
(Continued)

OTHER PUBLICATIONS

International Search Report issued Aug. 3, 2020 in PCT/EP2020/063461, with English translation, 5 pages.
(Continued)

*Primary Examiner* — Derek S. Chapel
(74) *Attorney, Agent, or Firm* — Grüneberg and Myers PLLC

(57) ABSTRACT

An illumination unit for microscopes has an MID structure for the free spatial arrangement of different electronic and optical components, so that surfaces of a three-dimensional carrier are available as a replacement for printed circuit boards. The MID structure designed as an illumination unit contains a closed annular main part having an annular free beam opening, where columns are arranged on the main part. On the free ends of the columns, illumination means are provided which can be contacted via conductor paths provided on the surface of the MID structure. The columns contain a cooling structure on a side surface facing away from the free beam opening, and a plug for the power supply and a control unit for controlling the illumination means are provided on the main part of the MID structure. The MID structure designed as an illumination unit is provided in a housing of a microscope objective.

11 Claims, 4 Drawing Sheets

(56) References Cited

U.S. PATENT DOCUMENTS

| | | | |
|---|---|---|---|
| 6,857,762 B2* | 2/2005 | Shimokawa | G01N 21/8806 362/241 |
| 7,670,064 B2 | 3/2010 | Frenzel | |
| 8,950,896 B2* | 2/2015 | Nishimori | F21V 5/04 362/244 |
| 2004/0136190 A1* | 7/2004 | Christoph | G02B 21/06 362/235 |
| 2004/0263960 A1* | 12/2004 | Obuchi | G02B 21/086 359/368 |
| 2008/0055924 A1* | 3/2008 | Ehrhardt | A61B 1/07 362/580 |
| 2010/0259816 A1* | 10/2010 | Feger | G02B 21/125 359/385 |
| 2011/0194176 A1* | 8/2011 | Behrend | A61B 5/0059 359/387 |
| 2012/0069584 A1 | 3/2012 | Kawabe et al. | |
| 2013/0170024 A1* | 7/2013 | Teplitz | G02B 21/084 359/387 |
| 2014/0340742 A1 | 11/2014 | Fahlbusch et al. | |
| 2015/0054979 A1 | 2/2015 | Ou et al. | |
| 2016/0147055 A1* | 5/2016 | Moriuchi | G02B 21/084 359/387 |
| 2017/0184831 A1* | 6/2017 | Prantl | G02B 3/0056 |
| 2017/0343476 A1* | 11/2017 | Boege | G02B 21/10 |

FOREIGN PATENT DOCUMENTS

| | | |
|---|---|---|
| DE | 10225919 | 4/2005 |
| DE | 10344767 | 6/2010 |
| EP | 0921568 | 6/1999 |
| JP | 2003-161887 | 6/2003 |
| JP | 2004-341394 | 12/2004 |
| JP | 2008-293692 | 12/2008 |
| JP | 2016-530567 | 9/2016 |
| WO | 2014/199339 | 12/2014 |

OTHER PUBLICATIONS

Written Opinion issued Aug. 3, 2020 in PCT/EP2020/063461, with English translation, 10 pages.

Notification of Transmittal of Translation of the International Preliminary Report on Patentability dated Dec. 21, 2021, including a translation of the written opinion (a foreign language version of the written opinion was previously submitted), 9 pages.

Chinese Office Action with Search Report dated Feb. 23, 2024, in Chinese Patent Application No. 202080052128.6, with English translation, 19 pages.

Japanese Office Action dated Mar. 5, 2024, in Japanese Application No. 2021-575447, with English translation, 8 pages.

* cited by examiner

ILLUMINATION UNIT FOR MICROSCOPES

CROSS-REFERENCE TO RELATED APPLICATIONS

This application is the National Stage entry under § 371 of International Application No. PCT/EP2020/063461, filed on May 14, 2020, and which claims the benefit of priority to Germany Application No. 10 2019 208 858.9, filed on Jun. 18, 2019. The content of each of these applications is hereby incorporated by reference in its entirety.

BACKGROUND OF THE INVENTION

Field of the Invention

The invention relates to an illumination unit for microscopes having an MID structure for freely spatially arranging different electronic and optical components.

Description of Related Art

Standard FR4 circuit boards, as well as rigid-flex or semi-flex circuit boards are currently used in microscopy in order to implement simple or complex circuits. Although these can improve the arrangement in space, they continue to be subject to the drawback of a planar surface. Mainly due to the severely restricted installation space, this often leads to complicated and expensive arrangement and mounting solutions. In addition, the use of the abovementioned types of printed circuit boards results in high costs and the risk of damage to the functionality due to breakages during mounting.

A number of uses of MID technology (MID=molded interconnected device) are known from the prior art for a wide variety of fields of application. For example, DE 102 25 919 B3 discloses an optical module and an optical system, in which the optical module has a lens holder into which a lens arrangement is inserted. The lenses are preferably aligned with one another and with respect to the lens holder owing to their geometric design so that no further optical adjustment of the system is required. The lens holder is designed as an MID with integrated conductor tracks and serves as a circuit carrier for a semiconductor element applied using flip-chip technology.

DE 103 44 767 B4 likewise discloses an optical module with a circuit carrier for a semiconductor element applied using flip-chip technology, wherein the circuit carrier has at least one thin region and one thick region, which holds the thin one, and the lens holder of the lens unit is held so as to be supported in the thin region of the circuit carrier. The thin and the thick regions are embodied in the form of MIDs with integrated conductor tracks.

The MDs known from the prior art are embodied in the form of compact units which, in the event of a repair, need to be exchanged as a whole and readjusted.

SUMMARY OF THE INVENTION

Proceeding from this prior art, the invention is based on the object of proposing an illumination unit for microscopes having an MID structure, which is improved in comparison with the prior art and is in particular easy to maintain.

To solve this problem, the invention proposes an illumination unit for microscopes having an MID structure with integrated conductor tracks for freely spatially arranging different electronic and optical components, which is characterized in that an existing MID structure has a main body with a ring-shaped free beam aperture, wherein columns, on the free ends of which light-emitting means are provided that are able to be contacted via conductor tracks provided on the surface of the MID structure, are arranged on the main body and wherein a plug for supplying power and a control unit for controlling the light-emitting means are provided on the main body of the MID structure.

DETAILED DESCRIPTION OF THE INVENTION

Figure 1:
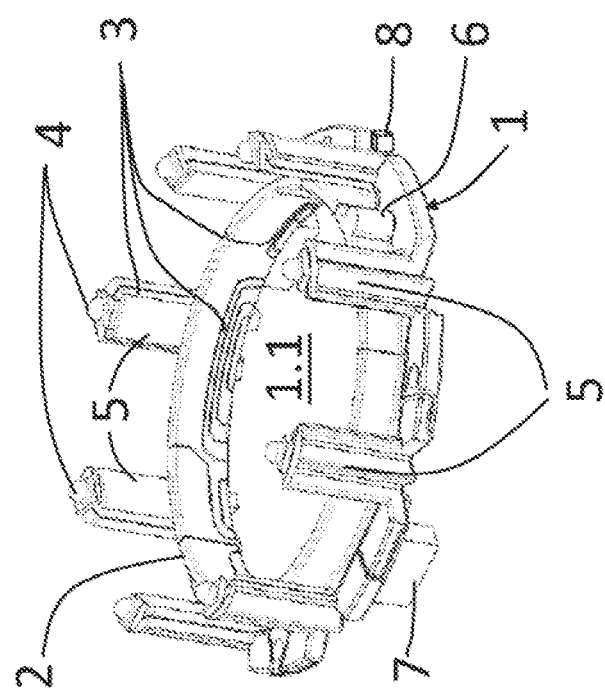
FIG. 1 shows a schematic illustration of a first exemplary embodiment of an illumination unit according to the invention.

The term of the ring-shaped beam aperture also includes deviations from a strictly round shape. The beam aperture can thus also have an oval, polygonal or irregular shape. It is essential that a beam which is typically round in cross section can pass through the closed beam aperture without undesired effects (e.g. asymmetric stopping-down).

Provision is advantageously made for the columns to have, on a side surface facing away from the free beam aperture, a metallically coated portion formed as a cooling structure or for the cooling structure of the columns to be formed as shaped elevations on a side surface facing away from the free beam aperture. The cooling structure can also have different elevations or is designed in the form of fins. The cooling structure is advantageously embodied to face away from the free beam aperture in order to reduce disruptive influences due to air flows of different density and refractive power. In addition to the heat sinks, further electrical or electronic components are additionally or alternatively arrangeable on the main body.

An advantageous development is also seen in the control unit being embodied in such a way that the light-emitting means are provided so as to be controllable jointly, in groups or individually for setting their respective individual intensities.

Provision is preferably made for the MID structure to be provided in a housing of a microscope objective, wherein a front lens of the microscope objective and optionally further optical lenses are arranged along an optical axis and the MID structure is guided and held against stops of the housing. The light-emitting means protrude out of the housing of the microscope objective next to the front lens to ensure uniform lighting of a sample to be observed or optically captured by means of the microscope objective. In addition, illumination of a region in front of the front lens from different directions is made possible.

A preferred embodiment is considered that, for the correct positioning of the MID structure in a receptacle of the housing of the microscope objective, an adjustment projection is formed on a side surface of the main body facing away from the free beam aperture. Furthermore, the microscope objective can have a shielding unit to prevent undesired incidence of the light from the light-emitting means into the interior of the microscope objective so that, using the shielding unit, only the light from the region in front of the front lens passes into the microscope objective and is collected by it. For example, a light-proof partition can be present between the light-emitting means and the microscope objective. The above-described arrangement of the light-emitting means and the shielding unit prevents light from the light-emitting means from passing into the beam path of the microscope objective without having been collected by the microscope objective.

An embodiment of the housing of the microscope objective, which is advantageous in terms of manufacturing technology, is that the illumination unit is either able to be plugged into the microscope objective or that the housing of the microscope objective is formed in multiple parts, wherein the individual segments of the MID structure formed as an illumination unit are held in the housing of the microscope objective so that they may be plugged together or fixedly connectable to one another.

A further development which is advantageous in terms of production technology is also that a housing of the microscope objective produced by means of MID technology has conductor tracks and a plug for the electrically conductive connection of an integrated control unit to the light-emitting means. Furthermore, the integrated control unit is connected to an integrated drive via the plug at the housing of the microscope objective, with the result that at least one of the lenses is displaced along the optical axis in order to perform a zoom function, for example.

By using MID technology in microscopy, in particular as an illumination unit in microscope objectives, it is possible to use the surface of a three-dimensional carrier with integrated conductor tracks as a replacement for printed circuit boards so that different electronic and optical components, such as diodes and sensors, can be arranged freely in space. Furthermore, by using MID technology, electrical, mechanical, and optical properties can be combined in one component, with the result that there is great potential for rationalization with regard to the number of components, mounting time, and manufacturing costs. If the MID structure, which is formed as an illumination unit, is provided so that it is able to be plugged into the housing of a microscope objective, simple and quick mounting and disassembly of the illumination unit and of the MID main body is achieved. In such an embodiment as an illumination module, the illumination unit is easy to install and to exchange as a whole component. In addition, in the case of a multi-part embodiment of the housing of the microscope objective, easy, quick, and simple mounting or disassembly can take place if the individual segments are able to be plugged together or, for example, screwed together.

The invention will be explained in more detail below on the basis of figures and exemplary embodiments.

Figure 2:
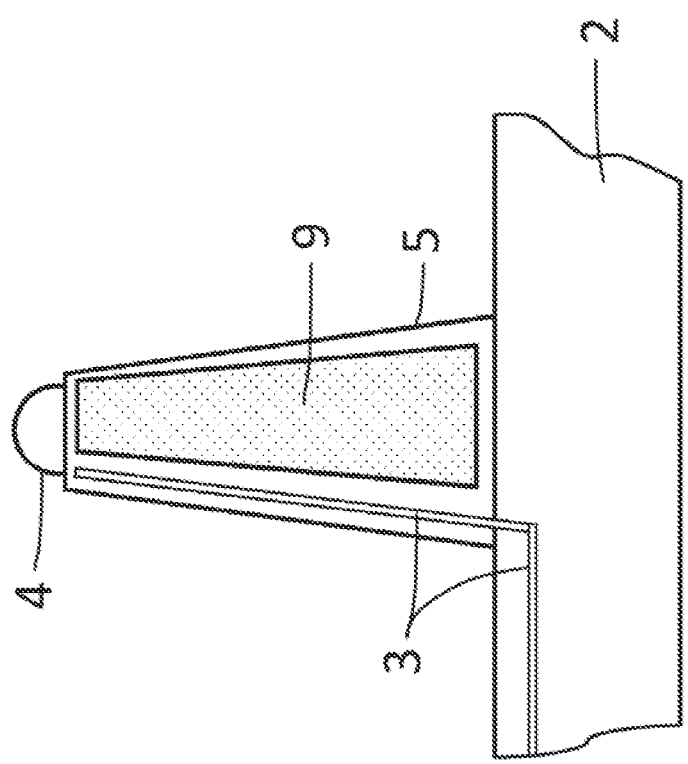
FIG. 2 shows a schematic illustration of a detailed view of a second exemplary embodiment of an illumination unit according to the invention.
Figure 3:
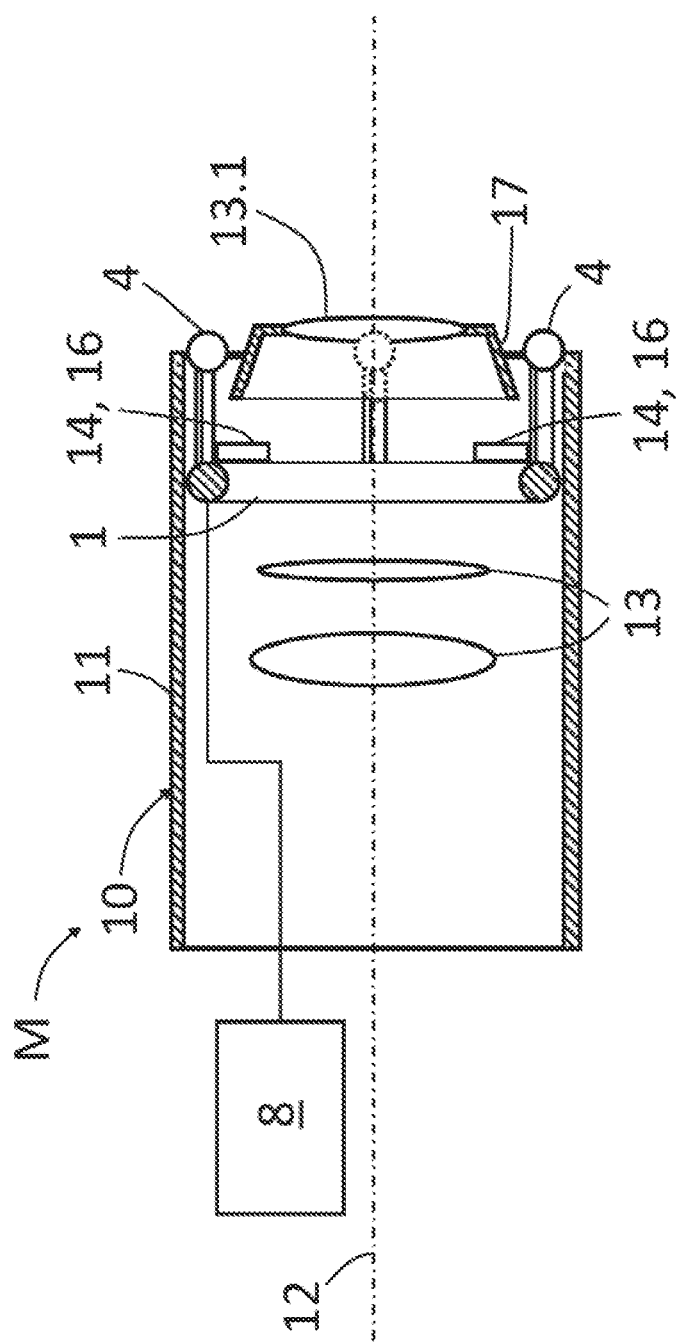
FIG. 3 shows a schematic illustration of a first exemplary embodiment of a microscope objective having the illumination unit according to the invention.
Figure 4:
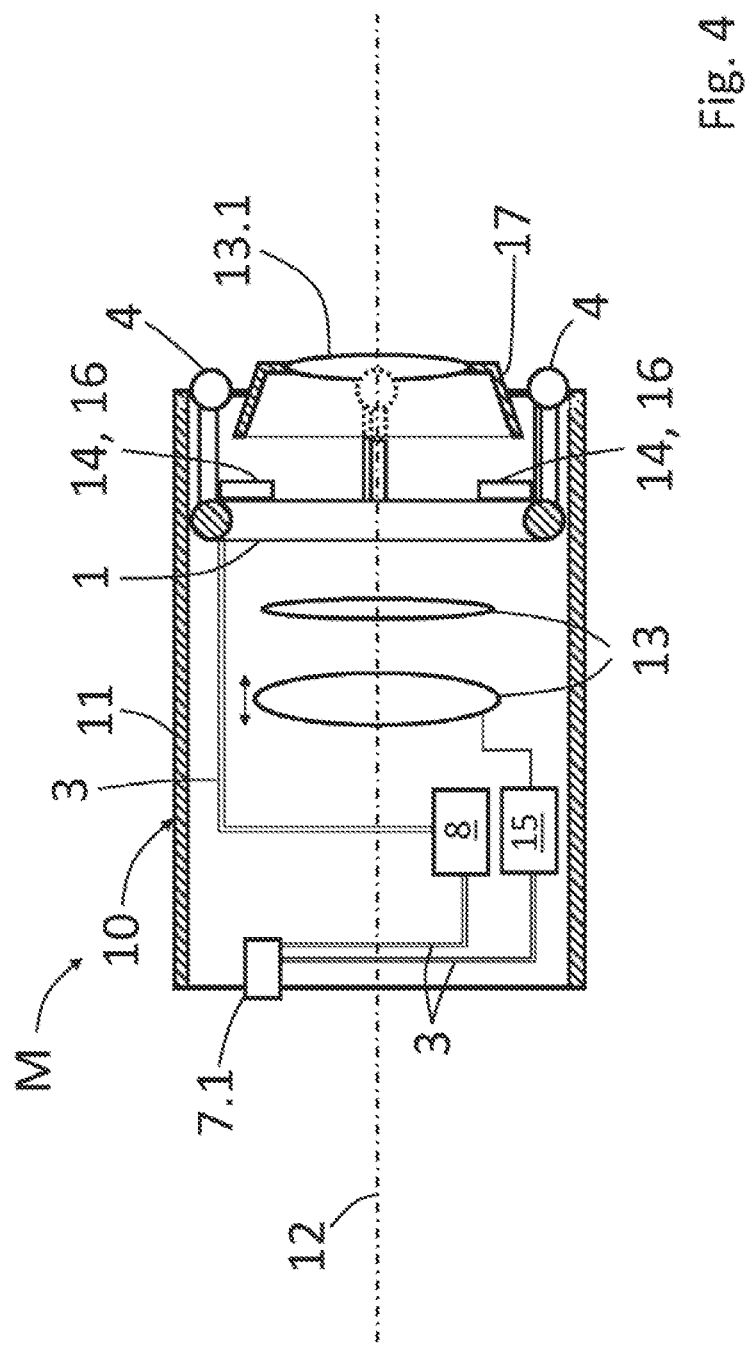
FIG. 4 shows a schematic illustration of a second exemplary embodiment of a microscope objective having the illumination unit according to the invention.

In the Figures:

FIG. 1 shows a schematic illustration of a first exemplary embodiment of an illumination unit according to the invention;

FIG. 2 shows a schematic illustration of a detailed view of a second exemplary embodiment of an illumination unit according to the invention;

FIG. 3 shows a schematic illustration of a first exemplary embodiment of a microscope objective having the illumination unit according to the invention; and FIG. 4 shows a schematic illustration of a second exemplary embodiment of a microscope objective having the illumination unit according to the invention.

FIG. 1 shows a main body 2 of an MID structure 1 of an illumination unit according to the invention with integrated conductor tracks 3 for freely spatially arranging different electronic and optical components, such as diodes and sensors. The MID structure 1 formed as an illumination unit has a main body 2 surrounding a free beam aperture 1.1 in the shape of a ring. On the surface of the MID structure 1, conductor tracks 3 are provided, which are used to make electrical contact with light-emitting means 4 in the form of LEDs or OLEDs, which are arranged on the free ends of columns 5 protruding from the main body 2 of the MID structure 1. In order to be able to position the MID structure 1 correctly in a receptacle, for example in a housing 11 of the microscope objective 10 (see FIGS. 3 and 4), an adjustment projection 6 is formed on a side surface of the main body 2 facing away from the free beam aperture 1.1. A plug 7 and a control unit 8 are furthermore present on the main body 2. The plug 7 is used to contact external supply sources for electrical energy and/or to transmit data in the form of electrical signals. The control unit 8 for controlling the light-emitting means 4 is embodied in such a way that the light-emitting means 4 are controllable jointly, in groups or individually and that, for example, their respective intensities are settable.

In further possible embodiments of the invention, further components, for example heat sinks, and/or other electrical and/or electronic components can additionally or alternatively be arranged on the main body 2.

FIG. 2 shows a detailed view of a section of an illumination unit, embodied according to the invention as an MID structure 1, with a cooling structure 9. Located on the main body 2 is a column 5, on the free end of which a light-emitting means 4 is provided, which is contacted via the conductor track 3 that is shown as an example. A cooling structure 9 in the form of a metallically coated portion of the column 5 is formed on a side surface of the column 5. The cooling structure 9 advantageously faces away from the free beam aperture 1.1 (see FIG. 1) in order to reduce disruptive influences due to air flows of different density and refractive power.

In further exemplary embodiments not shown in more detail, the cooling structure 9 is formed as fins or as differently shaped elevations.

FIG. 3 shows a first exemplary embodiment of the microscope objective 10 having the illumination unit according to the invention, formed as the MID structure 1, which is arranged in a housing 11 of the microscope objective 10. Optical lenses 13 and a front lens 13.1 of microscope objective 10 are optionally arranged along an optical axis 12. The MID structure 1 is guided against stops 14 of the housing 11 of the microscope objective 10 and held there. The stops 14 are part of a receptacle 16 for holding and positioning the MID structure 1. The light-emitting means 4 protrude out of the housing 11 next to the front lens 13.1 and enable illumination of a region located in front of the front lens 13.1 from different directions. In this way, for example, uniform lighting of a sample (not shown in more detail) to be observed and/or optically captured by means of the microscope objective 10 is possible. An undesirable incidence of light from the light-emitting means 4 into the optical system of the microscope objective 10 is avoided by means of a shielding unit 17 by way of a corresponding arrangement and shielding of the interior of the microscope objective 10 against the light-emitting means 4. In the exemplary embodiment, said shielding unit 17 is embodied as a partition in the form of a light-proof side wall of the microscope objective 10 (shown in a shortened form). Only light that comes from the region in front of the front lens 13.1 and is collected by the latter passes into the microscope objective 10. The light-emitting means 4 can be controlled jointly or selectively by means of the control unit 8, wherein the control unit 8 is arranged externally in this case. The MID structure 1 is advantageously plugged into, and thus efficiently mountable in, the housing 11 of the microscope objective 10. Individual mounting of each individual light-emitting means 4 is not required. An exchange of the MID structure 1 is also easily possible as necessary.

In addition, the housing 11 of the microscope objective 10 can also be formed in multiple parts. For example, segments thereof are then able to be plugged together or screwed together. Such an embodiment of the housing 11 makes the mounting and any replacement of the MID structure 1 easier. The housing 11 of the microscope objective 10 itself can also be produced by means of MID technology. The objective 10 and/or the housing 11 can be used in a microscope M (merely indicated).

The housing 11 itself can be produced by means of MID technology. As shown schematically in FIG. 4, the housing 11 has conductor tracks 3, which electrically conductively connect a plug 7.1 of the objective 10 to the optionally likewise integrated control unit 8 and the light-emitting means 4. A drive 15, which, in particular is likewise integrated, can be present in addition to the control unit 8. By means of the former, for example, at least one of the lenses 13 is displaceable along the optical axis 12 (symbolized by a double-headed arrow) in order to perform a zoom function, for example.

LIST OF REFERENCE SIGNS

1 MID-Structure
1.1 Free beam aperture
2 Main body
3 Conductor track
4 Light-emitting means
5 Column
6 Adjustment projection
7 Plug
7.1 Plug of the microscope objective
8 Control unit
9 Cooling structure
10 Microscope objective
11 Housing
12 Optical axis
13 Lens
13.1 Front lens
14 Stop
15 Drive
16 Receptacle
17 Shielding unit
M Microscope

The invention claimed is:
1. An illumination unit for microscopes, comprising:
a molded interconnected device (MID) structure for freely spatially arranging different electronic and optical components, wherein the MID structure has a closed, ring-shaped main body with a ring-shaped free beam aperture and is in contact with an interior side surface of a housing of a microscope objective at a location between different lenses of the microscope objective, wherein columns are arranged on the ring-shaped main body, wherein a plurality of light emitters are arranged on free ends of the columns and are contacted via conductor tracks provided on a surface of the MID structure, and
wherein a plug for supplying power and a circuit configured to control the plurality of light emitters are provided on the ring-shaped main body of the MID structure.

2. The illumination unit as claimed in claim 1, wherein the columns have, on a side surface facing away from the ring-shaped free beam aperture, a metallically coated portion formed as a cooling structure.

3. The illumination unit as claimed in claim 2, wherein the cooling structure is formed as an elevation on the side surface facing away from the ring-shaped free beam aperture.

4. The illumination unit as claimed in claim 1, wherein the plurality of light emitters are controllable jointly, in groups, or individually by the circuit in order to set their respective individual intensities.

5. An illumination unit for microscopes, comprising:
a molded interconnected device (MID) structure for freely spatially arranging different electronic and optical components, wherein the MID structure has a closed, ring-shaped main body with a ring-shaped free beam aperture,
wherein columns are arranged on the ring-shaped main body, wherein a plurality of light emitters are arranged on free ends of the columns and are contacted via conductor tracks provided on a surface of the MID structure, and
wherein a plug for supplying power and a circuit configured to control the plurality of light emitters are provided on the ring-shaped main body of the MID structure,
wherein the MID structure is arranged in a housing of the microscope objective,
wherein a front lens of the microscope objective is arranged along an optical axis,
wherein the MID structure is guided and held against stops of the housing, and
wherein the plurality of light emitters protrude out of the housing of the microscope objective next to the front lens and are configured to uniformly light a sample to be observed and/or optically captured by the microscope objective.

6. The illumination unit as claimed in claim 5, wherein for correct positioning of the MID structure in a receptacle of the housing of the microscope objective, an adjustment projection is formed on a side surface of the ring-shaped main body facing away from the ring-shaped free beam aperture.

7. The illumination unit as claimed in claim 5, wherein the microscope objective has a shield configured to prevent incidence of light from the plurality of light emitters into an interior of the microscope objective.

8. The illumination unit as claimed in claim 5, wherein the MID structure is able to be plugged into the housing of the microscope objective.

9. The illumination unit as claimed in claim 5, wherein the housing of the microscope objective is formed in multiple parts, wherein individual segments and the MID structure are able to be plugged together or fixedly connectable to one another.

10. The illumination unit as claimed in claim 5, wherein the housing of the microscope objective is formed as an MID structure, wherein the housing has conductor tracks and a further plug for electrically conductive connection of an integrated control unit to the plurality of light emitters.

11. The illumination unit as claimed in claim 10, wherein the integrated control unit is connected via the further plug at the housing of the microscope objective to an integrated drive for displacing at least one of the optical lenses along the optical axis.

\* \* \* \* \*

UNITED STATES PATENT AND TRADEMARK OFFICE
CERTIFICATE OF CORRECTION

| | | |
|---|---|---|
| PATENT NO. | : 12,001,000 B2 | |
| APPLICATION NO. | : 17/596640 | |
| DATED | : June 4, 2024 | |
| INVENTOR(S) | : Büchner et al. | |

It is certified that error appears in the above-identified patent and that said Letters Patent is hereby corrected as shown below:

On the Title Page

On the second page, under Item (56) OTHER PUBLICATIONS, Column 2, Line 3 currently reads:
"Notification of Transmittal of Translation"
And should read:
--Notification of Transmittal of Copies of Translation--; and In the Specification Column 1, Line 54 currently reads:
"MDs"
And should read:
--MIDs--.

Signed and Sealed this
Thirteenth Day of August, 2024

Katherine Kelly Vidal
*Director of the United States Patent and Trademark Office*